(12) United States Patent
Sano

(10) Patent No.: US 6,743,730 B1
(45) Date of Patent: Jun. 1, 2004

(54) PLASMA PROCESSING METHOD

(75) Inventor: Michiaki Sano, Chiba (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/671,201

(22) Filed: Sep. 28, 2000

(30) Foreign Application Priority Data

Sep. 29, 1999 (JP) .......................................... 11-276912

(51) Int. Cl.$^7$ ............................................. H01L 21/302
(52) U.S. Cl. ...................... 438/706; 438/710; 438/712; 438/713; 216/64; 216/67
(58) Field of Search ................................ 438/706, 710, 438/712, 713; 156/345; 216/64, 67, 72

(56) References Cited

U.S. PATENT DOCUMENTS

| | | | | |
|---|---|---|---|---|
| 5,250,165 A | * | 10/1993 | Berglund et al. | 204/192.3 |
| 5,354,421 A | * | 10/1994 | Tatsumi et al. | 156/345 |
| 5,635,021 A | * | 6/1997 | Harafuji | 438/714 |
| 5,997,687 A | * | 12/1999 | Koshimizu | 156/345 |
| 6,043,164 A | * | 3/2000 | Nguyen et al. | 438/736 |
| 6,046,114 A | * | 4/2000 | Tohda | 438/695 |
| 6,218,084 B1 | * | 4/2001 | Yang et al. | 430/239 |
| 6,284,149 B1 | * | 9/2001 | Li et al. | 216/64 |
| 6,379,574 B1 | * | 4/2002 | Ou-Yang et al. | 216/49 |

FOREIGN PATENT DOCUMENTS

JP      10-27789      1/1998

\* cited by examiner

*Primary Examiner*—Lan Vinh
(74) *Attorney, Agent, or Firm*—Finnegan Henderson Farabow Garrett & Dunner, L.L.P.

(57) ABSTRACT

A plasma processing method that makes it possible to remove a photoresist film and fence portion while maintaining a specific shape of the opening is provided. After a wafer W is placed on a lower electrode 106 provided inside a processing chamber 102 of an ashing apparatus 100, power with its frequency set at 60 MHz and its level set at 1 kW and power with its frequency set at 2 MHz and its level set at 250 W are respectively applied to an upper electrode 122 and the lower electrode 106. A processing gas induced into the processing chamber 102 is raised to plasma, a photoresist film 208 at the wafer W is ashed and, at the same time, fence portion 214 formed around the opening of a via hole 210 during the etching process is removed. The level of the power applied to the lower electrode 106 is set equal to or lower than 10 W before the photoresist film 208 is completely removed. As a result, the energy level of the ions induced into the wafer W becomes reduced, so that the photoresist film 208 is ashed without grinding shoulders 210*a* and 212*a* of the via hole 210 and groove 212 at the $SiO_2$ film.

25 Claims, 6 Drawing Sheets

PLASMA PROCESSING METHOD

BACKGROUND OF THE INVENTION

The present invention relates to a plasma processing method.

PRIOR ART

When forming a specific pattern at a workpiece through plasma etching technology, a photoresist film is normally utilized as a mask. The photoresist film must be removed after the etching process under normal circumstances. Accordingly, a plasma ashing technology is proposed in the prior art as a technology through which the photoresist film is removed. A plasma ashing apparatus having an upper electrode and a lower electrode facing opposite each other inside a processing chamber is employed in the plasma ashing process. In this apparatus, high-frequency power with a specific frequency is applied to the upper electrode and high-frequency power with a frequency lower than the frequency of the power applied to the upper electrode is applied to the lower electrode. This raises the processing gas induced into the processing chamber to plasma and, as a result, the photoresist film formed at the workpiece placed on the lower electrode is removed (ashed).

However, in the ashing processing method described above, in which high-frequency power for biasing achieving a specific power level is continuously applied to the workpiece on the lower electrode, the ions in the plasma act on the workpiece to an excessive degree before the process ends. Thus, at a workpiece 10 assuming the damascene structure illustrated in FIG. 5(a), for instance, not only the photoresist film on an $SiO_2$ film 12 constituting a layer insulating film is removed but also shoulders 14a of a via hole 14 and shoulders 16a of a groove 16 formed at the $SiO_2$ film 12 are removed. In addition, the internal diameter of the via hole 14 and the cross sectional width of the groove 16 along the shorter side increase. This poses a problem in that no ultra-fine wiring structure can be formed at the workpiece 10. It is to be noted that a TiN film 18 and a W film 20 are formed under the $SiO_2$ film 12 at the workpiece 10.

If, on the other hand, the process is implemented without applying high-frequency power for biasing to the workpiece unlike in the ashing method described above, the quantities of ions and radicals induced to the workpiece are reduced. Thus, the shoulders 14a of the via hole 14 or the shoulders 16a of the groove 16 are not milled and the internal diameter of the via hole 14 and the cross sectional width of the groove 16 along the shorter side do not increase, as shown in FIG. 5(b). However, there is a problem with this ashing method in that so-called fence portion 14b formed during the etching process are not removed. It is to be noted that the fence portion 14b distend from the area around the opening of the via hole 14 toward the upper portion of the groove 16. As a result, a specific wiring structure cannot be formed inside the via hole 14 or inside the groove 16.

SUMMARY OF THE INVENTION

An object of the present invention, which has been completed by addressing the problems of the technologies in the prior art discussed above, is to provide a new and improved plasma processing method which makes it possible to eliminate the problems explained above and other problems.

In order to achieve the object described above, in a first aspect of the present invention, a plasma processing method for removing a photoresist film formed at a workpiece placed inside a processing chamber by raising a processing gas induced into the processing chamber to plasma, comprising a step in which high-frequency power for biasing at a first power level is applied to the workpiece, a step in which the processing gas is raised to plasma and a step in which high-frequency power for biasing at a second power level is applied to the workpiece by switching the high-frequency power for biasing at the first power level to the high-frequency power for biasing at the second power level lower than the first power level before the photoresist film is completely removed, as disclosed in claim 1, is provided.

According to the present invention, plasma processing is first implemented by applying the highfrequency power for biasing at the first power level to the workpiece. The first power level is set so as to allow ions with a relatively high energy level to be induced to the workpiece. Thus, fence portion formed at the workpiece during the etching process, for instance, can be removed while removing the photoresist film. In addition, according to the present invention, plasma processing is implemented by switching the high-frequency power applied to the workpiece from the first power level to the second power level before the photoresist film is completely removed. The second power level is set so as to allow ions with a relatively low energy level to be induced to the workpiece. As a result, the photoresist film can be removed without affecting the lower layer structure beneath the photoresist film.

In addition, in order to achieve the object described above, in a second aspect of the present invention, a plasma processing method for removing a photoresist film formed at a workpiece placed inside a processing chamber by raising a processing gas induced into the processing chamber to plasma, comprising a step in which highfrequency power for biasing is applied to the workpiece, a step in which the processing gas is raised to plasma and a step in which the application of the high-frequency power for biasing is stopped before the photoresist film is completely removed, as disclosed in claim 2, is provided.

According to the present invention, plasma processing is first implemented by applying the high-frequency power for biasing to the workpiece. The level of the high-frequency power for biasing is set roughly equal to the first power level mentioned earlier. As a result, the photoresist film and the fence portion can be removed at the same time. Furthermore, according to the present invention, the supply of the high-frequency power for biasing to the workpiece is stopped before the photoresist film is completely removed. Thus, the energy of the ions induced to the workpiece is reduced, so that the photoresist film is removed without affecting the lower layer structure beneath the photoresist film.

In a third or fourth aspect of the present invention, a plasma processing method in which a plasma etching process is first implemented at the workpiece halfway through a specific layer by using as a mask a photoresist film having an opening pattern with a larger opening area than the opening area of a hole formed at the specific layer with the opening pattern containing the opening of the hole and then the photoresist film is removed, as disclosed in claim 3 or claim 4, comprising steps similar to those disclosed in claim 1 or claim 2, is provided.

When a plasma etching process is implemented on the workpiece, fence portion is formed around the opening of the hole. Through the process implemented by performing steps similar to those disclosed in claim 1 or claim 2, the photoresist film and the fence portion can be removed at the same time while retaining a pattern achieving a specific form.

Furthermore, it is desirable that the present invention be adopted in conjunction with a photoresist film constituting a mask utilized to form a specific pattern at an SiO$_2$ film or an organic film formed on a workpiece, as disclosed in claims 5 or 6, for instance. When an SiO$_2$ film or an organic film is patterned by using a photoresist film as a mask through a plasma etching process in order to achieve, for instance, a damascene structure, fence portion is formed at the pattern area. In addition, SiO$_2$ and organic materials are easily milled by plasma. Thus, by removing the photoresist film according to the present invention as disclosed in claims 1–4, the fence portion is removed at the same time, while ensuring that any damage to the pattern formed at the SiO$_2$ film or the organic film is prevented.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The following is a detailed explanation of the plasma processing method according to the present invention adopted in a plasma ashing method, given in reference to the attached drawings.

(First Embodiment)
(1) Structure of Ashing Apparatus

Figure 1:
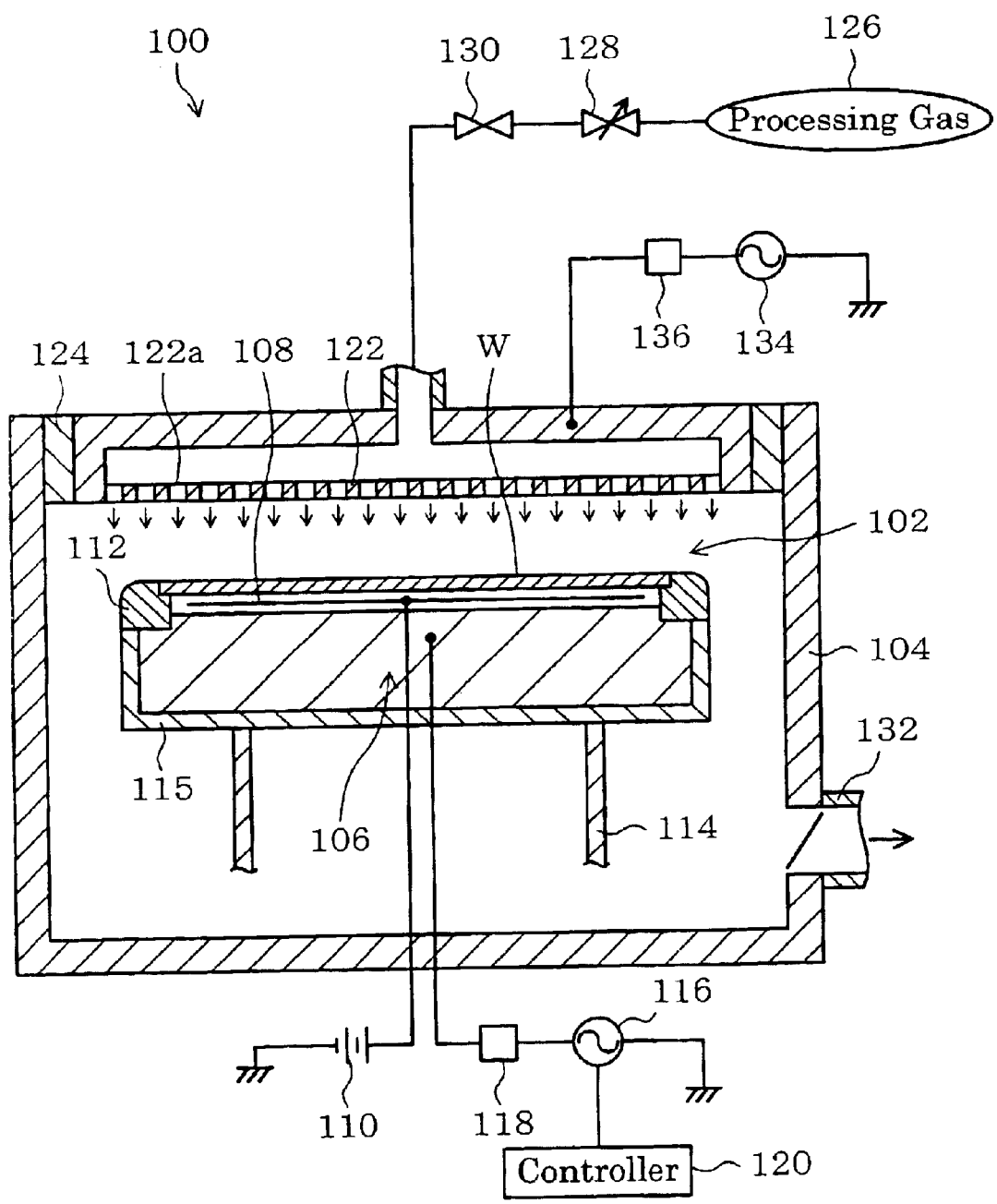
FIG. 1 is a schematic sectional view of an ashing apparatus which may adopt the present invention.

First, in reference to FIG. 1, the structure of an ashing apparatus 100 that may adopt the ashing method in the embodiment is explained. A processing chamber 102 is formed inside a conductive and airtight processing container 104. The processing container 104 is grounded for safety. A conductive lower electrode 106 is provided inside the processing chamber 102. The lower electrode 106 also constitutes a stage on which a wafer W is placed. An electrostatic chuck 108 is provided at the mounting surface of the lower electrode 106. When a high level DC voltage output from a high voltage DC source 110 is applied, the electrostatic chuck 108 electrically holds the wafer W. In addition, a ring body 112 is provided on the lower electrode 106 to enclose the periphery of the mounted wafer W. Driven by a drive mechanism (not shown), the lower electrode 106 is allowed to travel up and down freely via an elevator shaft 114 and an insulating member 115.

In addition, a first high-frequency source 116 is connected to the lower electrode 106 via a first matcher 118. The first high-frequency source 116 outputs the high-frequency power for biasing in the embodiment to be detailed later, which is applied to the lower electrode 106. A controller 120 is connected to the first high-frequency source 116. The controller 120 controls the first high-frequency source 116 to adjust the output of the high-frequency power for biasing. It is to be noted that the details of the control on the high-frequency power for biasing are to be explained later.

A conductive upper electrode 122 facing opposite the mounting surface of the lower electrode 106 is provided inside the processing chamber 102. The upper electrode 122 is provided in the processing container 104 via an insulating member 124. Numerous gas outlet hole 122a are formed at the upper electrode 122. Thus, a processing gas supplied from a gas supply source 126 is supplied into the upper electrode 122 via a flow regulating valve 128, an open/close valve 130 and the gas outlet hole 122a. The gas inside the processing chamber 102 is discharged by a vacuum pump (not shown) via a discharge pipe 132. A second high-frequency source 134 is connected to the upper electrode 122 via a second matcher 136. The second high-frequency source 134 outputs plasma generating high-frequency power which is applied to the upper electrode 122.

(2) Wafer Structure

Figure 2A:
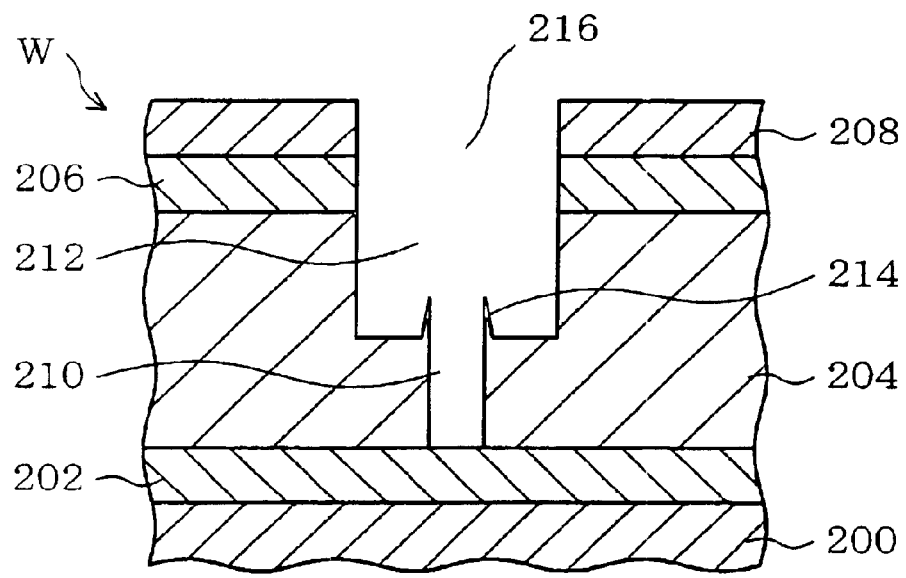
FIG. 2(a) is a schematic sectional view of a wafer before undergoing the ashing process.
Figure 3A:
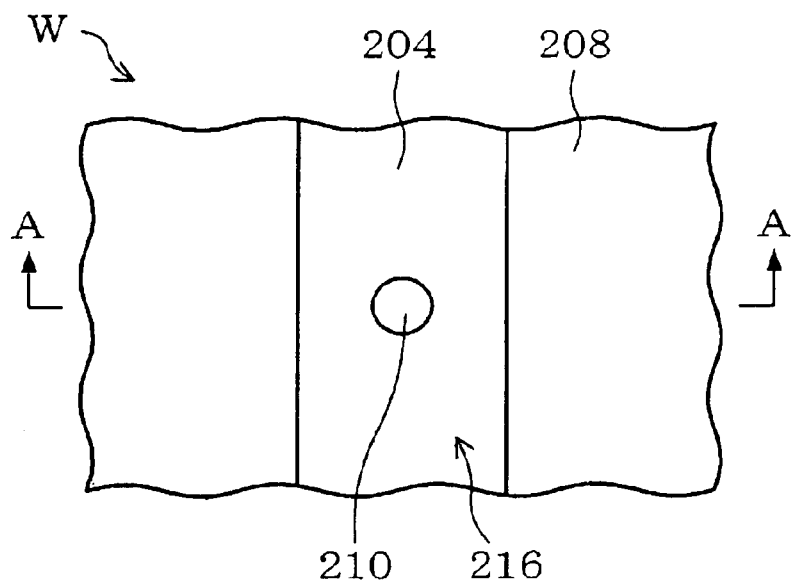
FIG. 3(a) is a schematic plan view of a wafer before undergoing the ashing process with groove yet to be formed through the etching process and FIG. 3(b) is a schematic sectional view of the wafer in FIG. 3(a) through the plane extending along line A—A.
Figure 3B:
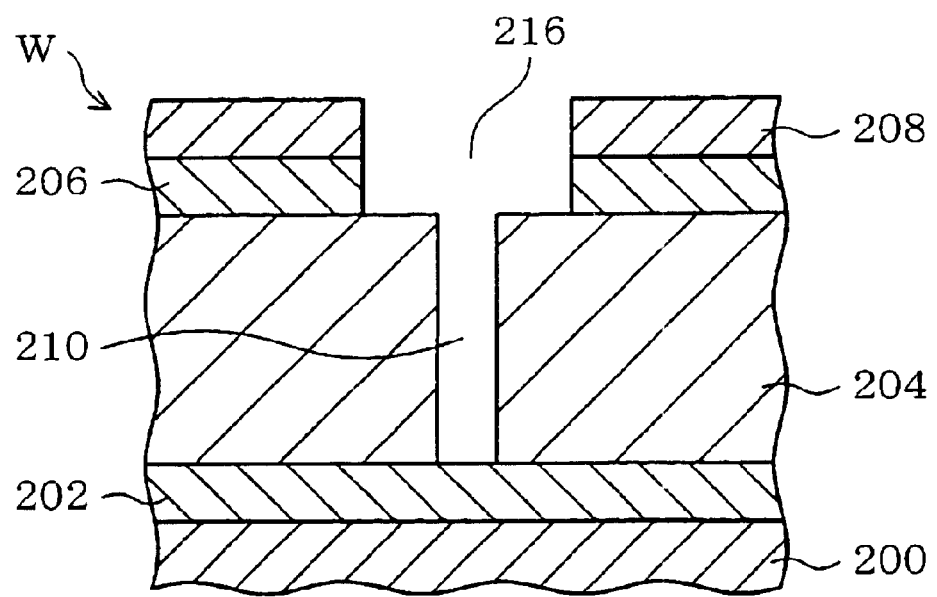

Next, a wafer W to undergo the ashing process is explained. As shown in FIG. 2(a), the wafer W having undergone various types of processing such as a film forming process and an etching process achieves a damascene structure. Namely, a W film 200 for wiring is formed at the wafer W. An SiO$_2$ film (specific layer) 204 constituting a layer insulating film is laminated over the W film 200 via a TiN film 202 provided to prevent oxidation of the W film 200. In addition, a via hole (hole) 210 in which the wiring material is to be embedded and a groove 212 are sequentially formed through plasma etching. The cross sectional width of the groove 212 is set larger than the cross sectional width of the via hole 210. Also, around the opening of the via hole 210 at the bottom of the groove 212, fence portion 214 distending the upper portion groove 212 is formed through the etching process. A photoresist film 208 having been utilized as a mask during the etching process is laminated over the SiO$_2$ film 204 via a reflection-preventing film 206. An opening pattern 216 in a rough groove form having a larger opening area than the opening area of the via hole 210 and communicating with the opening of the via hole 210 is formed at the photoresist film 208 as illustrated in FIG. 2(a) and FIGS. 3(a) and 3(b) showing the state prior to the etching process. It is to be noted that as detailed later, the reflection-preventing film 206 and the photoresist film 208 are removed concurrently in the embodiment. Furthermore, the embodiment may be adopted in conjunction with an organic film instead of the SiO$_2$ film 204.

(3) Ashing Process

Next, the ashing process implemented on the photoresist film 208 is explained in detail. First, the wafer W shown in FIG. 2(*a*) is placed on the lower electrode 106 shown in FIG. 1. Then, the processing gas, e.g., a mixed gas containing $O_2$ and Ar, is induced into the processing chamber 102 from the processing gas supply source 126. In addition, vacuum drawing is implemented inside the processing chamber 102 to sustain the pressure at 10 mTorr. Subsequently, plasma generating high-frequency power with its frequency set at 60 MHz and its level set at 1 kW, for instance, is applied to the upper electrode 122. At the same time, high-frequency power for biasing with its frequency set at 2 MHz and its power level set at a first level, i.e., 250 W, for instance, is applied to the lower electrode 106.

Figure 2B:
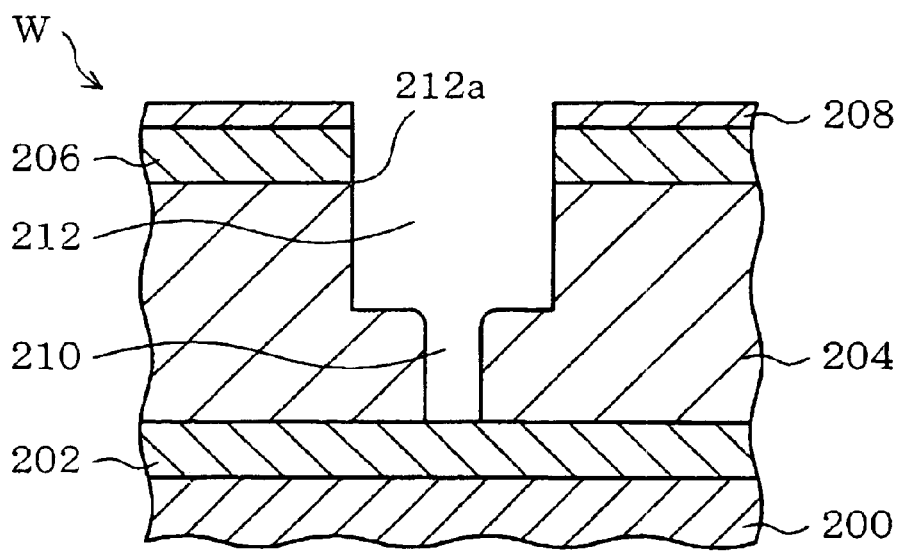
FIG. 2(b) is a schematic sectional view illustrating the state of the wafer when the power level of the high-frequency power for biasing is switched during the ashing process and FIG. 2(c) is a schematic sectional view of the wafer having undergone the ashing process.
Figure 2C:
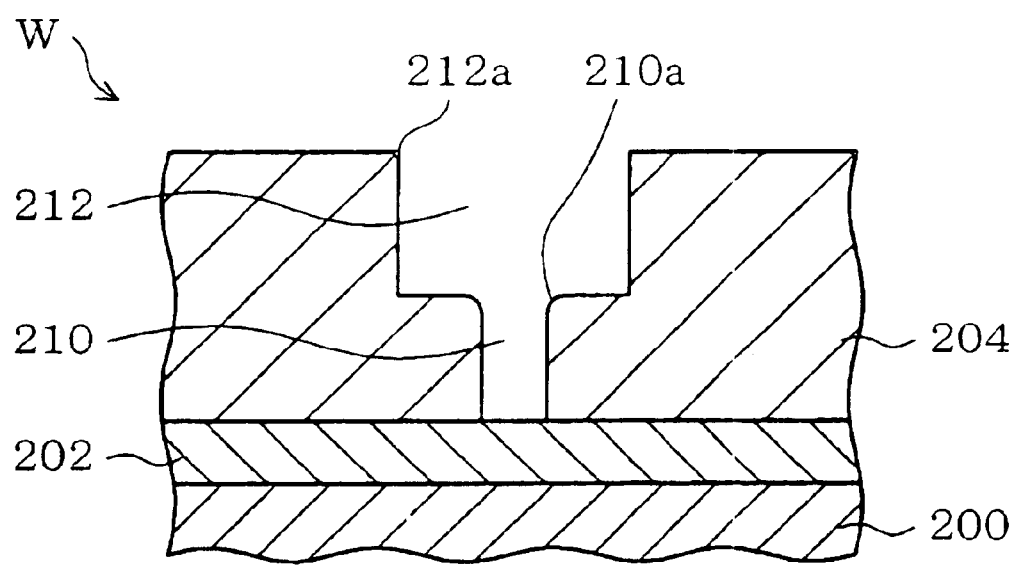

The processing gas is raised to plasma by the plasma generating high-frequency power. In addition, ions in the plasma are induced into the wafer W by the high-frequency power for biasing. As a result, the photoresist film 208 becomes ashed, as illustrated in FIG. 2(*b*). The high-frequency power for biasing at the first power level, which is relatively higher than a second power level to be detailed later and approximately equal to the power level set in the ashing method in the prior art described above, is also applied to the wafer W via the lower electrode 106. Thus, ions with relatively high energy are induced into the wafer W. Consequently, the fence portion 214 can be removed concurrently while grinding the photoresist film 208.

Furthermore, while the high-frequency power for biasing at the first power level is applied, the photoresist film 208 and the reflection-preventing film 206 are still not completely removed in the embodiment. Thus, the upper surface of the $SiO_2$ film 204 and shoulder portions 212*a* of the groove 212 are protected by the photoresist film 208 and the reflection-preventing film 206. Consequently, the upper surface of the $SiO_2$ film 204 and the shoulders portions 212*a* of the groove 212 are not exposed to the ions and, therefore, are not milled. As a result, the shape of the groove 212 and the thickness of the $SiO_2$ film 204 are not changed during the etching process.

Next while the photoresist film 208 is not completely removed yet, the high-frequency power for biasing applied to the lower electrode 106 is switched from the first power level to the second power level. The second power level is set relatively low compared to the first power level, e.g., 10 W or lower. Thus, the energy of the ions induced into the wafer W while applying highfrequency power for biasing at the second power level is reduced. As a result, as illustrated in FIG. 2(*c*), the photoresist film 208 and the reflection-preventing film 206 can be removed without grinding the $SiO_2$ film 204 and the TiN film 202. It is to be noted that the other processing conditions are the same as those under which the high-frequency power for biasing at the first power level is applied.

In addition, the high-frequency power for biasing is switched from the first power level to the second power level before the photoresist film 208 is completely removed as described above, and more desirably, before the photoresist film 208 is completely removed but after the fence portion 214 is removed, as illustrated in FIG. 2(*b*). By setting the timing of the power level switching as described above, the removal of the photoresist film 208 and the reflection-preventing film 206 and the removal of the fence portion 214 can be implemented in a single process, as illustrated in FIG. 2(*c*). Furthermore, a shoulders 210*a* of the via hole 210 and the shoulders 212*a* of the groove are not ground during this step.

The timing with which the power level is switched is calculated in advance based upon the length of time required for the removal of the photoresist film 208 and the length of time required for the removal of the fence portion 214 and is set at the controller 120. The controller 120 controls the first high-frequency source 116 in conformance to the switching timing. In this structure, the first high-frequency source 116 outputs the high-frequency power for biasing at the first power level to the lower electrode 106 during the period of time extending from the process start until the power level is switched. Then, the first high-frequency source 116 outputs the high-frequency power for biasing at the second power level to the lower electrode 106 during the period of time extending from the power level switch until the end of processing.

(Second Embodiment)

Next, a second embodiment of the present invention is explained. This embodiment is characterized in that the supply of the high-frequency power for biasing at the first power level applied to the lower electrode 106 is stopped before the photoresist film 208 is completely removed. It is to be noted that since the apparatus in which the embodiment is adopted, the various conditions under which the process is implemented other than the condition with regard to the application of the high-frequency power for biasing to the lower electrode 106 and the structure of the wafer W undergoing the ashing process are identical to those in the first embodiment explained earlier, their explanation is omitted.

As in the first embodiment, the ashing process is first implemented on the wafer W shown in FIG. 2(*a*) placed on the lower electrode 106 by applying the high-frequency power for biasing at the first power level to the lower electrode 106 in FIG. 1 in the second embodiment. As a result, the photoresist film 208 is ashed and, at the same time, the fence portion 214 is removed as illustrated in FIG. 2(*b*).

Next, the controller 120 implements control on the first high-frequency source 116 to stop the output of the high-frequency power for biasing at the first power level before the photoresist film 208 is completely removed but after the fence portion 214 is removed, i.e., in the state illustrated in FIG. 2(*b*) and explained in reference to the first embodiment. Consequently, the energy of the ions induced to the wafer W is reduced to allow removal of the photoresist film 208 and the reflection-preventing film 206 without milling the $SiO_2$ film 204 and the TiN film 202, as shown in FIG. 2(*c*).

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

Figure 4A:
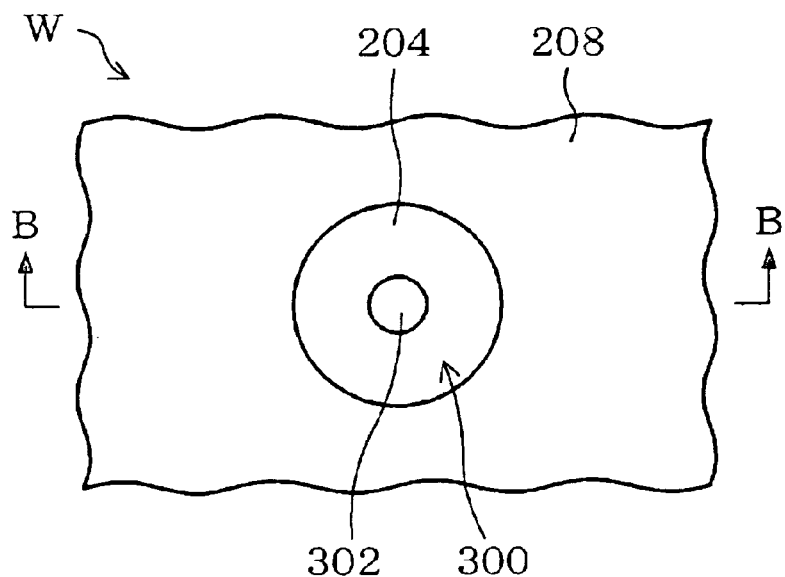
FIG. 4(a) is a schematic plan view of a wafer before undergoing another ashing process in which the present invention may be adopted with contact hole yet to be formed through the etching process and FIG. 4(b) is a schematic sectional view of the wafer in FIG. 4(a) through the plane extending along line B—B.
Figure 4B:
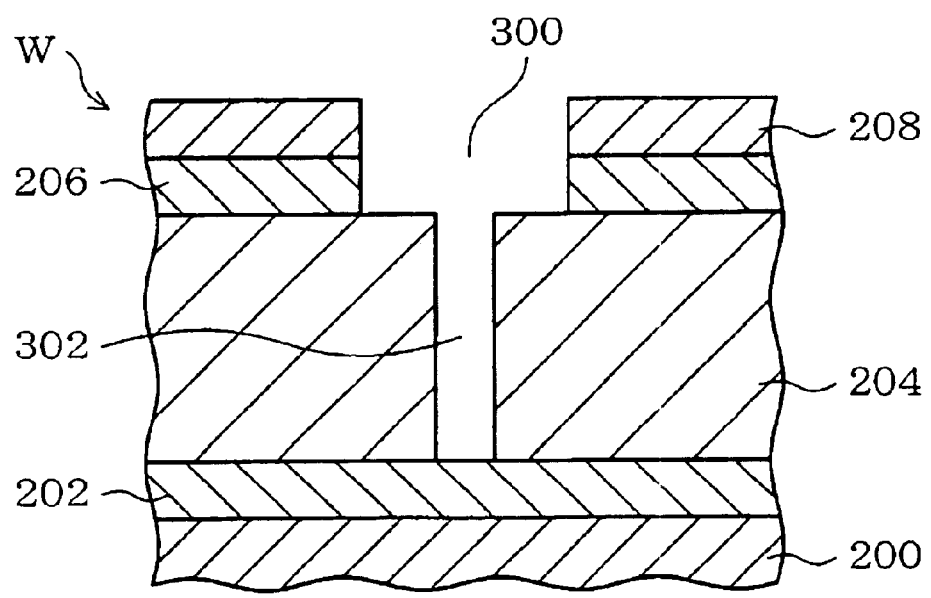
Figure 5A:
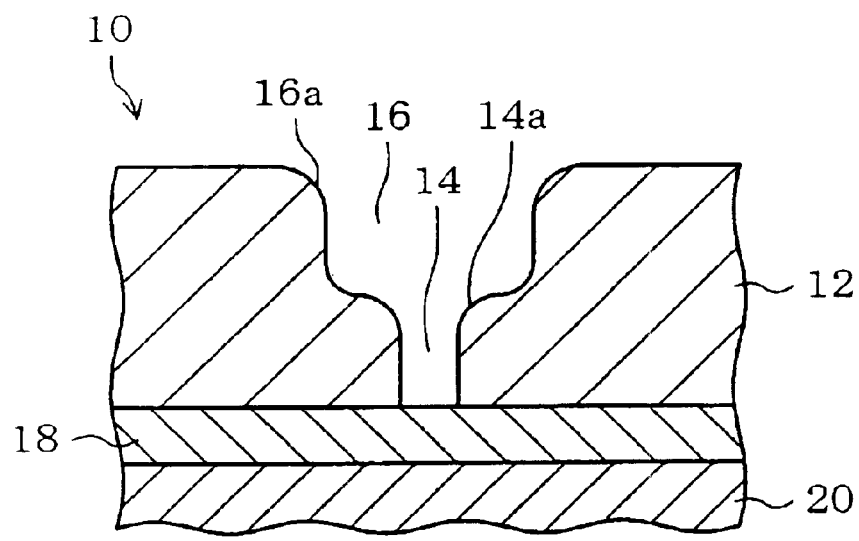
FIG. 5(a) is a schematic sectional view of a wafer having undergone an ashing process in the prior art in which high-frequency power for biasing at a constant level is continuously applied and FIG. 5(b) is the schematic sectional view of the wafer having undergone an ashing process in the prior art in which no high-frequency power for biasing is applied.
Figure 5B:
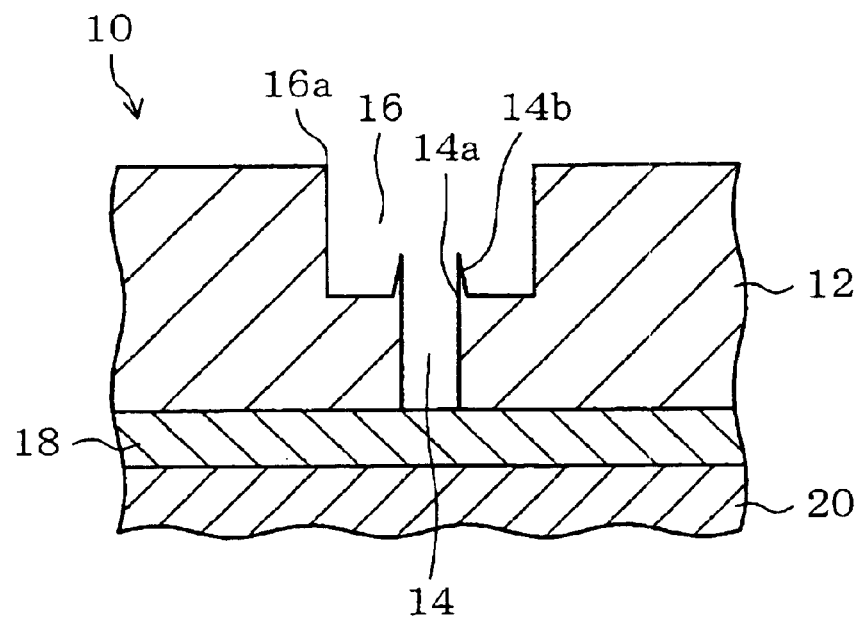

For instance, while an explanation is given above in reference to the embodiments on an example in which an ashing process is implemented on a wafer having a groove formed above a via hole, the present invention is not restricted by these structural particulars, and may be adopted when implementing an ashing process on a wafer formed through the following steps, for instance. Namely, as illustrated in FIGS. 4(*a*) and 4(*b*) a photoresist film 208 having a roughly circular opening pattern 300 is first formed over an $SiO_2$ film 204 at the wafer W. The opening pattern 300 is positioned so as to communicate with a first contact hole 302 and has a larger opening area then the opening area of the first contact hole 302. Next, using the photoresist film 208 as a mask, the $SiO_2$ film 204 is etched down to a specific depth of the first contact hole 302 at the wafer W to form a second contact hole having a larger internal diameter than the first contact hole 302 above the first contact hole 302. At the wafer W, fence portion is formed around the opening of the first contact hole 302 at the bottom of the second contact hole. Thus, by implementing the ashing process in the first embodiment or the second embodiment on this wafer W, the photoresist film 208 and the fence portion can be removed at the same time without damaging the pattern form that has been achieved. It is to be noted that the wafer W yet to undergo the ashing process which is explained in reference to the first embodiment and has a different opening pattern, too, is formed by implementing the steps described above.

In addition, while an explanation is given above in reference to the embodiments on an example in which the present invention is adopted in a plane parallel plasma etching apparatus, the present invention is not restricted by such details, and may be adopted in any of various other plasma processing apparatuses including a microwave plasma processing apparatus, an electron cyclotron resonance type plasma processing apparatus and an inductively coupled plasma processing apparatus.

According to the present invention, the fence portion formed during the etching process can be removed concurrently with the removal of the photoresist film, while maintaining the pattern achieved at the workpiece through the etching process.

The entire disclosure of Japanese patent application no. 11-276912 filed on Sep. 29, 1999 including specification, claims, drawings and summary is incorporated herein by reference in its entirety.

What is claimed is:

1. A plasma processing method for removing a photoresist film covering a layer formed at a workpiece placed within a processing chamber, wherein the layer has an opening and a fence portion distending toward the upper portion of a surrounding edge of the opening, the processing method comprising:

applying high-frequency power for biasing to the workpiece at a first power level;

raising the processing gas to a plasma; and switching the high-frequency power for biasing applied to the workpiece from the first power level to a second power level lower than the first power level before the photoresist film becomes completely removed.

2. A plasma processing method according to claim 1, wherein the fence portion is removed during applying high-frequency power for biasing to the workpiece at the first power level.

3. A plasma processing method according to claim 1, wherein the first power level is switched to the second power level due to removing the fence portion.

4. A plasma processing method according to claim 1, wherein the layer is an $SiO_2$ film formed at the workpiece.

5. A plasma processing method according to claim 1, wherein the layer is an organic film formed at the workpiece.

6. A plasma processing method for removing a photoresist film covering a layer formed at a workpiece placed within a processing chamber, comprising:

etching the layer;

applying high-frequency power for biasing to the workpiece at a first power level and removing a fence portion distending toward the upper portion of a surrounding edge of an opening formed at the layer during the etching step;

raising the processing gas to a plasma; and switching the high-frequency power for biasing applied to the workpiece from the first power level to a second power level lower than the first power level before the photoresist film becomes completely removed.

7. A plasma processing method according to claim 6, wherein the layer is an $SiO_2$ film formed at the workpiece.

8. A plasma processing method according to claim 6, wherein the layer is an organic film formed at the workpiece.

9. A plasma processing method for removing a photoresist film formed at a workpiece placed within a processing chamber, comprising:

applying high-frequency power for biasing to the workpiece;

raising the processing gas to a plasma;

ashing the photoresist film while applying the high-frequency power for biasing to the workpiece; and after the ashing step, stopping application of the high-frequency power for biasing before the photoresist film becomes completely removed, while utilizing the same type of processing gas both before and after stopping application of the high-frequency power.

10. A plasma processing method according to claim 9, wherein the photoresist film constitutes a mask used to form a specific pattern at an $SiO_2$ film formed at the workpiece.

11. A plasma processing method according to claim 9, wherein the photoresist film constitutes a mask used to form a specific pattern at an organic film formed at the workpiece.

12. A plasma processing method for removing a photoresist film having an opening pattern with a larger opening area than an opening area of a hole formed at a specific layer of a workpiece, the opening of the hole contained in the opening pattern when the specific layer is etched to a middle portion thereof by utilizing the photoresist film as a mask, comprising:

applying high-frequency power for biasing to the workpiece;

raising the processing gas to a plasma;

ashing the photoresist while applying the high-frequency power for biasing to the workpiece; and after the ashing step, stopping the application of the high-frequency power for biasing before the photoresist film becomes completely removed.

13. A plasma processing method according to claim 12, wherein the specific layer is an $SiO_2$ film formed at the workpiece.

14. A plasma processing method according to claim 12, wherein the specific layer is an organic film formed at the workpiece.

15. A plasma processing method comprising:

etching a film by utilizing a resist film as a mask;

thereafter removing the resist film substantially halfway with biasing power; and thereafter removing the remaining resist film completely without applying any biasing power.

16. A plasma processing method according to claim 15, wherein the resist film constitutes a mask used to form a specific pattern at an $SiO_2$ film formed at the workpiece.

17. A plasma processing method according to claim 15, wherein the resist film constitutes a mask used to form a specific pattern at an organic film formed at the workpiece.

18. A plasma processing method for removing a photoresist film covering a layer formed at a workpiece, wherein the layer has an opening, the photoresist film has an opening pattern exposing the opening of the layer, the opening pattern of the photoresist film is larger than the opening of the layer, and the opening of the layer has a fence portion of the layer distending upwardly, the processing method comprising:

raising a processing gas to a plasma;

applying a biasing power to the workpiece;

removing the photoresist film substantially halfway with the fence portion;

thereafter, stopping application of the biasing power with the photoresist film remaining; and thereafter, removing the photoresist film completely, while utilizing the processing gas same as the processing gas for removing the photoresist film substantially halfway.

19. A plasma processing method according to claim 18, wherein the fence portion is removed during applying biasing power to the workpiece at the first power level.

20. A plasma processing method according to claim 18, wherein the first power level is switched to the second power level due to removing the fence portion.

21. A plasma processing method according to claim 18, wherein the layer is an $SiO_2$ film formed at the workpiece.

22. A plasma processing method according to claim 18, wherein the layer is an organic film formed at the workpiece.

23. A plasma processing method for removing a photoresist film covering a layer formed at a workpiece, wherein the layer has an opening, and the photoresist film has an opening pattern exposing the opening of the layer, the opening pattern of the photoresist film is larger than the opening of the layer, the processing method comprising:

etching the layer;

raising a processing gas to a plasma;

removing a fence portion of the layer formed during the etching process and distending toward the upper portion of the opening while applying biasing power to the workpiece; and thereafter, stopping application of the biasing power with the photoresist film remaining.

24. A plasma processing method according to claim 23, wherein the layer is an $SiO_2$ film formed at the workpiece.

25. A plasma processing method according to claim 23, wherein the layer is an organic film formed at the workpiece.

* * * * *